US012519202B2

(12) United States Patent
Ogata (10) Patent No.: US 12,519,202 B2
(45) Date of Patent: Jan. 6, 2026

(54) POWER DIVIDER

(71) Applicant: Murata Manufacturing Co., Ltd., Nagaokakyo (JP)

(72) Inventor: Makoto Ogata, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 103 days.

(21) Appl. No.: 18/605,938

(22) Filed: Mar. 15, 2024

(65) Prior Publication Data

US 2024/0222838 A1    Jul. 4, 2024

Related U.S. Application Data

(63) Continuation of application No. PCT/JP2022/029826, filed on Aug. 3, 2022.

(30) Foreign Application Priority Data

Sep. 21, 2021    (JP) .................................. 2021-153152

(51) Int. Cl.
*H01P 5/16* (2006.01)
*H01F 27/28* (2006.01)
*H01F 27/29* (2006.01)
*H01F 27/40* (2006.01)

(52) U.S. Cl.
CPC ............ *H01P 5/16* (2013.01); *H01F 27/2804* (2013.01); *H01F 27/292* (2013.01); *H01F 27/40* (2013.01); *H01F 2027/2809* (2013.01)

(58) Field of Classification Search
CPC ......... H03H 2001/0085; H03H 7/0115; H03H 7/1775; H03H 7/1708; H03H 7/1725;
(Continued)

(56) References Cited

U.S. PATENT DOCUMENTS 11,811,125 B2 * 11/2023 Ogata ..................... H01P 5/19
11,972,894 B2 * 4/2024 Ogata ..................... H01P 5/16
(Continued)

FOREIGN PATENT DOCUMENTS

JP      2002344276 A    11/2002
JP      2011166344 A     8/2011
(Continued)

OTHER PUBLICATIONS

International Search Report in PCT/JP2022/029826. mailed Nov. 1, 2022, 3 pages.
(Continued)

*Primary Examiner* — Lincoln D Donovan
*Assistant Examiner* — Tyler J Pereny
(74) *Attorney, Agent, or Firm* — Keating & Bennett, LLP (57) ABSTRACT

A power divider includes a common terminal, a ground terminal, first and second terminals, a first circuit connected to a common terminal, and a second circuit to divide a signal from the first circuit and transfer divided signals to the first and second terminals. The first circuit includes inductors connected in parallel between the common terminal and a branching point, and capacitors each connected between a corresponding end of the inductors and a ground terminal. The second circuit includes one inductor connected between the branching point and the first terminal, another inductor connected between the branching circuit and the second terminal, one capacitor connected between the first terminal and the ground terminal, another capacitor connected between the second terminal and the ground terminal, and a resistor connected between the first and second terminals.

17 Claims, 10 Drawing Sheets

(58) Field of Classification Search
CPC ...... H03H 7/1766; H03H 7/09; H03H 7/1758; H03H 7/0161; H03H 7/03; H03H 7/075; H03H 7/463; H03H 7/48; H01F 17/0013; H01F 2017/0026; H01F 27/2804; H01F 2027/2809; H01F 27/29; H01F 27/00; H01F 27/292; H01F 27/40; H01G 4/40; H01G 4/30; H01G 4/012; H01P 1/20; H01P 5/16; H01P 7/00

See application file for complete search history.

(56) References Cited

U.S. PATENT DOCUMENTS

| | | | |
|---|---|---|---|
| 2017/0338793 A1* | 11/2017 | Chueh | H03H 7/48 |
| 2021/0167482 A1 | 6/2021 | Ogata et al. | |
| 2021/0265105 A1 | 8/2021 | Ogata et al. | |
| 2021/0407728 A1 | 12/2021 | Toujo | |

FOREIGN PATENT DOCUMENTS

| | | | |
|---|---|---|---|
| WO | 2020045576 A1 | 3/2020 | |
| WO | 2020121985 A1 | 6/2020 | |
| WO | 2021085002 A1 | 5/2021 | |

OTHER PUBLICATIONS

Written Opinion in PCT/JP2022/029826, mailed Nov. 1, 2022, 4 pages.

* cited by examiner

POWER DIVIDER

CROSS REFERENCE TO RELATED APPLICATIONS

This application claims the benefit of priority to Japanese Patent Application No. 2021-153152 filed on Sep. 21, 2021 and is a Continuation application of PCT Application No. PCT/JP2022/029826 filed on Aug. 3, 2022. The entire contents of each application are hereby incorporated herein by reference.

BACKGROUND OF THE INVENTION

1. Field of the Invention

The present disclosure relates to power dividers, and more particularly, to a technology to improve characteristics of the power divider.

2. Description of the Related Art

WO 2020/045576 discloses a power dividing/coupling component for dividing or coupling radio-frequency power. With the power dividing/coupling component disclosed in WO 2020/045576, an isolation characteristic can be improved by disposing an inductor connected between a common terminal and a connection point at which a path is branched to a first terminal and a second terminal, and by disposing a capacitor connected between each of the common terminal and the connection point and the ground.

The power divider as described above is used for, for example, a mobile terminal such as a mobile phone or a smart phone as well as a base station in mobile communications. In recent years, an array antenna including a plurality of radiating elements may be used as an antenna used in each of these communication devices. In this case, the power divider described above is required to supply the radio-frequency signal to the respective radiating elements through the plurality of branched paths.

In such a power divider, it has been desired to obtain a wider band characteristic, and in order to achieve such a characteristic, it is necessary to prevent a fluctuation in characteristics between the divided signals.

SUMMARY OF THE INVENTION

Example embodiments of the present invention provide power dividers with a wider band by preventing a fluctuation in characteristics between divided signals.

A power divider according to an example embodiment of the present includes a common terminal, a ground terminal, a first terminal, a second terminal, a first circuit, and a second circuit. The first circuit is connected to the common terminal. The second circuit is connected to the first terminal and the second terminal to divide a signal having passed through the first circuit at a branching point, and to transfer the divided signals to the first terminal and the second terminal. The first circuit includes a first inductor and a second inductor connected in parallel between the common terminal and the branching point, a first capacitor connected between the common terminal and the ground terminal, and a second capacitor connected between the branching point and the ground terminal. The second circuit includes a third inductor, a fourth inductor, a third capacitor, a fourth capacitor, and a resistor. The third inductor includes one end connected to the branching point. The third inductor is located in a path from the branching point to the first terminal. The fourth inductor includes one end connected to the branching point. The fourth inductor is located in a path from the branching point to the second terminal. The third capacitor is connected between another end of the third inductor and the ground terminal. The fourth capacitor is connected between another end of the fourth inductor and the ground terminal. The resistor is connected between the another end of the third inductor and the another end of the fourth inductor.

According to example embodiments of the present invention, two inductors connected in parallel are provided between the common terminal and the branching point. Thus, the path from the common terminal to the first terminal and the path from the common terminal to the second terminal are symmetrical to one another. Thus, a fluctuation in characteristics between the divided signals is able to be prevented so as to achieve a wide band.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Hereinafter, example embodiments of the present invention will be described in detail with reference to drawings.

In the drawings, the same or corresponding portions are denoted by the same reference characters and will not be described repeatedly.

First Example Embodiment

Circuit Configuration of Power Divider

Figure 1:
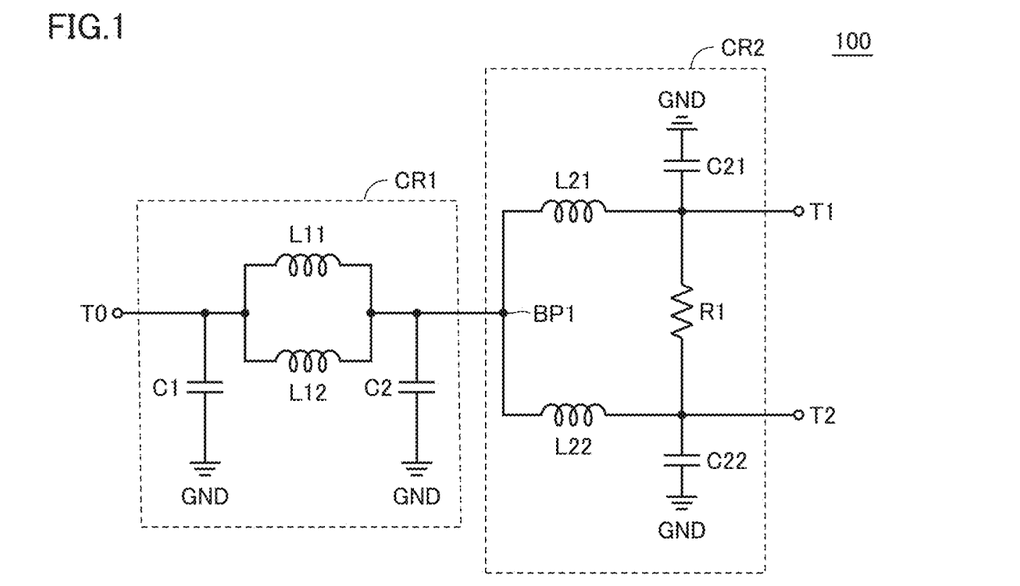
FIG. 1 is an equivalent circuit diagram of a power divider according to a first example embodiment of the present invention.

FIG. 1 is an equivalent circuit diagram of a power divider 100 according to a first example embodiment of the present invention. Power divider 100 is used, for example, to divide a common radio-frequency signal for a plurality of radiating elements, such as an array antenna in which a plurality of radiating elements are provided.

Referring to FIG. 1, power divider 100 includes a common terminal T0, a first terminal T1, a second terminal T2, a first circuit CR1, and a second circuit CR2. First circuit CR1 is connected to common terminal T0. Second circuit CR2 is connected between first circuit CR1 and each of first terminal T1 and second terminal T2. Second circuit CR2 divides a signal that has been supplied to common terminal T0 and that has passed through first circuit CR1, and transfers the divided signals to first terminal T1 and second terminal T2.

First circuit CR1 includes inductors L11, L12, and capacitors C1, C2. Inductor L11 and inductor L12 are connected in parallel between common terminal T0 and branching point BP1 of second circuit CR2. Capacitor C1 is connected between common terminal T0 and a ground terminal GND. Capacitor C2 is connected between branching point BP1 and a ground terminal GND. That is, first circuit CR1 defines and functions as a π-type low-pass filter.

Second circuit CR2 inductors includes L21, L22, capacitors C21, C22, and a resistive element R1. Inductor L21 is connected between branching point BP1 and first terminal T1. The first circuit CR1 is connected to the branching point BP1. Inductor L22 is connected between branching point BP1 and second terminal T2.

Capacitor C21 is connected between first terminal T1 and a ground terminal GND. Capacitor C22 is connected between second terminal T2 and a ground terminal GND. Resistive element R1 is connected between first terminal T1 and second terminal T2.

In second circuit CR2, the inductance value of inductor L21 is set to the same or substantially the same value as the inductance value of inductor L22. The capacitance value of capacitor C21 is set to the same or substantially the same value as the capacitance value of capacitor C22. That is, the impedance value of a path from branching point BP1 to first terminal T1 is the same or substantially the same as the impedance value of a path from branching point BP1 to second terminal T2. Thus, the power supplied to common terminal T0 is equally or substantially equally divided by second circuit CR2, and output from first terminal T1 and second terminal T2.

In the circuit described above, at least one attenuation pole is defined by first circuit CR1 in an isolation characteristic of the path from first terminal T1 to second terminal T2. One attenuation pole is defined in the isolation characteristic by resistive element R1 included in second circuit CR2.

Structure of Power Divider

Figure 2:
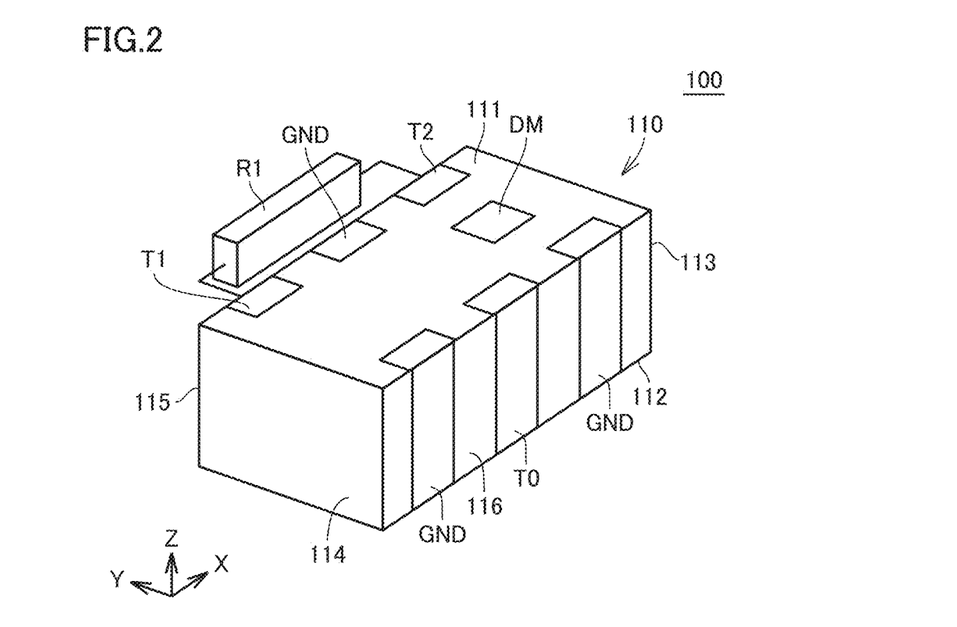
FIG. 2 is a perspective view of an outer shape of the power divider according to the first example embodiment of the present invention.
Figure 3:
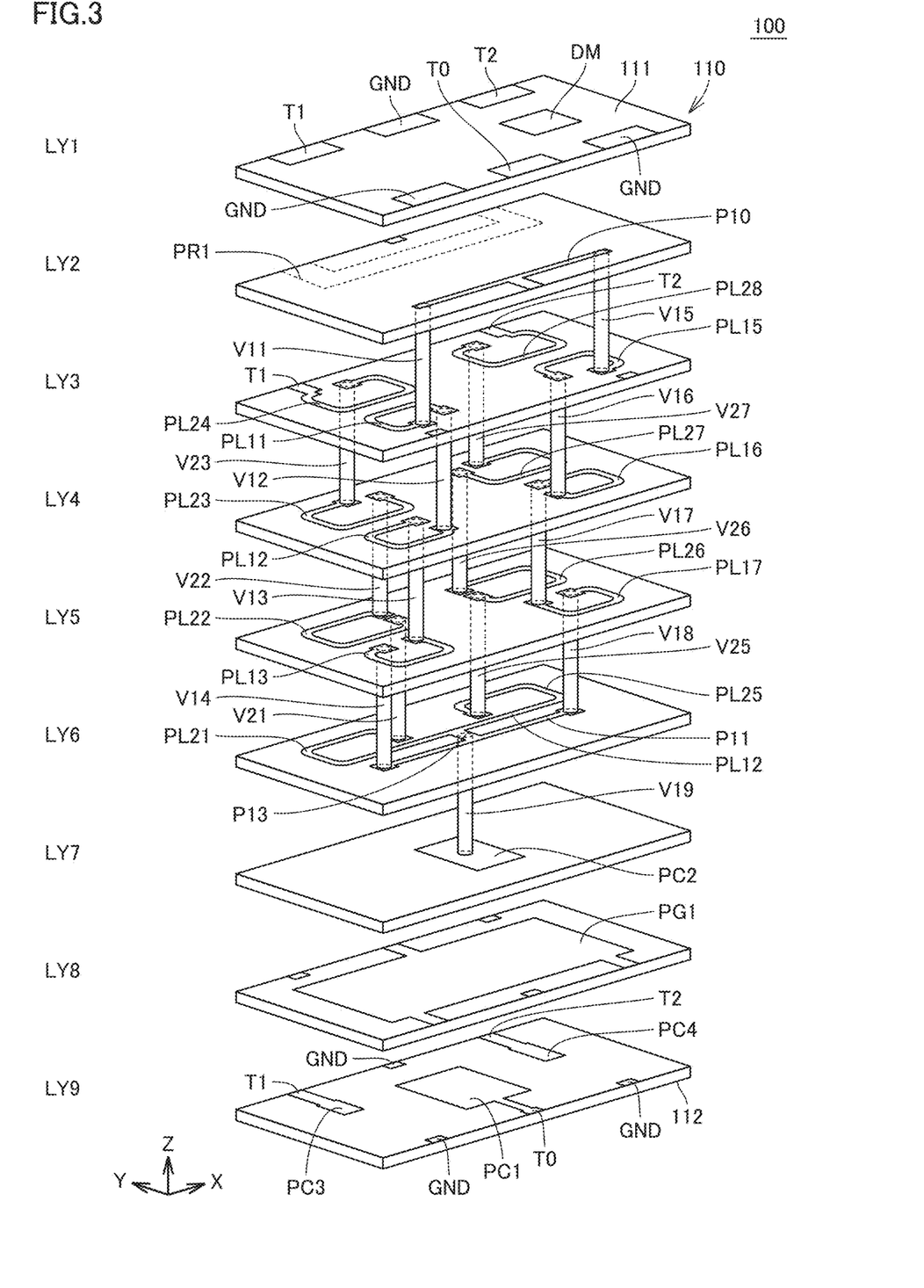
FIG. 3 is an exploded perspective view of the power divider of FIG. 2.

Next, a detailed structure of power divider 100 will be described with reference to FIGS. 2 and 3. FIG. 2 is a perspective view of an outer shape of power divider 100. FIG. 3 is an exploded perspective view showing an exemplary stack structure of power divider 100.

Referring to FIGS. 2 and 3, power divider 100 includes a stack body 110 and resistive element R1 provided outside stack body 110. In the stack body 110, a plurality of dielectric layers LY1 to LY9 are stacked in a stacking direction. Stack body 110 has a cuboid or substantially cuboid shape. Each of dielectric layers LY1 to LY9 is made of, for example, a resin or a ceramic such as a low-temperature co-fired ceramic (LTCC). In stack body 110, the inductors and the capacitors in first circuit CR1 and second circuit CR2 of FIG. 1 are defined by a plurality of electrodes provided in each dielectric layer and a plurality of vias provided between the dielectric layers. In the present specification, the "via" represents a conductor provided in a dielectric layer in order to connect electrodes provided in different dielectric layers. The via is made of, for example, a conductive paste, plating, and/or a metal pin.

In the description below, a "Z axis direction" is defined as a stacking direction in which dielectric layers LY1 to LY9 are stacked in stack body 110 An "X axis direction" is defined as a direction perpendicular or substantially perpendicular to the Z axis direction and along each long side of stack body 110 A "Y axis direction" is defined as a direction along each short side of stack body 110. Also in the description below, a positive Z axis direction in each figure may be referred to as an upper side and a negative Z axis direction may be referred to as a lower side.

Stack body 110 includes an upper surface 111, a lower surface 112, and side surfaces 113 to 116. Upper surface 111 is a surface of stack body 110 in the positive Z axis direction, and lower surface 112 is a surface of stack body 110 in the negative Z axis direction. Side surface 113 is a surface of stack body 110 in a positive X axis direction, and side surface 114 is a surface of stack body 110 in a negative X axis direction. Side surface 115 is a surface of stack body 110 in a positive Y axis direction, and side surface 116 is a surface of stack body 110 in a negative Y axis direction.

A directional mark DM to specify a direction of power divider 100 is disposed on upper surface 111 (dielectric layer LY1) of stack body 110. A plurality of external terminals (common terminal T0, first terminal T1, second terminal T2, and ground terminals GND) to connect stack body 110 to another device are disposed on side surfaces 115, 116 of stack body 110. Each of the external terminals has a C shape or a substantially C shape and extends from upper surface 111 to lower surface 112 through side surface 115 or extends from upper surface 111 to lower surface 112 through side surface 116. First terminal T1, second terminal T2, and ground terminal GND are disposed on a side of the side surface 115. Common terminal T0 and ground terminals GND are disposed on a side of the side surface 116. Resistive element R1 is connected to first terminal T1 and second terminal T2.

Common terminal T0 is connected to a capacitor electrode PC1 disposed in dielectric layer LY9 on a side of the lower surface 112. When stack body 110 is viewed in the stacking direction (Z axis direction) in a plan view, capacitor electrode PC1 at least partially overlaps with a ground electrode PG1 disposed in dielectric layer LY8. Ground electrode PG1 has a rectangular or substantially rectangular shape. Ground electrode PG1 is connected to ground terminals GND. Capacitor electrode PC1 and ground electrode PG1 define capacitor C1 in first circuit CR1 of FIG. 1.

Common terminal T0 is also connected to a flat plate electrode P10 disposed in dielectric layer LY2. Flat plate electrode P10 extends in the X axis direction and has a strip shape. Flat plate electrode P10 is connected to common terminal T0 at a central portion. A via V11 is connected to one end of flat plate electrode P10 A via V15 is connected to the other end of flat plate electrode P10.

Via V11 is connected to one end of a flat plate electrode PL11 disposed in dielectric layer LY3 and has a strip shape. Flat plate electrode PL11 has a U or substantially U shape or a C or substantially C shape. A via V12 is connected to the other end of flat plate electrode PL11. Via V12 is connected to one end of a flat plate electrode PL12 disposed in dielectric layer LY4 and having a strip shape. Flat plate electrode PL12 has a U or substantially U shape or a C or substantially C shape. A via V13 is connected to the other end of flat plate electrode PL12. Via V13 is connected to one end of a flat plate electrode PL13 disposed in dielectric layer LY5 and having a strip shape. Flat plate electrode PL13 has a U or substantially U shape or a C or substantially C shape. A via V14 is connected to the other end of flat plate electrode PL13.

When stack body 110 is viewed in the stacking direction in a plan view, flat plate electrodes PL11, PL12, PL13 are disposed such that most portions of paths thereof overlap with one another. That is, flat plate electrodes PL11, PL12, PL13 and vias V11, V12, V13, V14 define a helical coil with a winding axis corresponding to the Z axis. This helical coil corresponds to inductor L11 in FIG. 1.

Via V15 is connected to one end of a flat plate electrode PL15 disposed in dielectric layer LY3 and having a strip shape. Flat plate electrode PL15 has a U or substantially U shape or a C or substantially C shape. A via V16 is connected to the other end of flat plate electrode PL15. Via V16 is connected to one end of a flat plate electrode PL16 disposed in dielectric layer LY4 and having a strip shape. Flat plate electrode PL16 has a U or substantially U shape or a C or substantially C shape. A via V17 is connected to the other end of flat plate electrode PL16. Via V17 is connected to one end of a flat plate electrode PL17 disposed in dielectric layer LY5 and having a strip shape. Flat plate electrode PL17 has a U or substantially U shape or a C or substantially C shape. A via V18 is connected to the other end of flat plate electrode PL17.

When stack body 110 is viewed in the stacking direction in a plan view, flat plate electrodes PL15, PL16, PL17 are disposed such that most portions of paths thereof overlap with one another. That is, flat plate electrodes PL15, PL16, PL17 and vias V15, V16, V17, V18 define a helical coil with a winding axis corresponding to the Z axis. This helical coil corresponds to inductor L12 in FIG. 1.

Via V14 of inductor L11 and via V18 of inductor L12 are connected to flat plate electrode P11 disposed in dielectric layer LY6. Flat plate electrode P11 extends in the X axis direction and having a strip shape. Via V14 is connected to one end of flat plate electrode P11. Via V18 is connected to the other end of flat plate electrode P11. Flat plate electrode P11 includes a central portion connected to a flat plate electrode P12 extending in parallel or substantially in parallel with flat plate electrode P11.

A via V19 is connected to a connection portion P13 that connects flat plate electrode P11 and flat plate electrode P12. Via V19 is connected to a flat plate electrode PC2 disposed in dielectric layer LY7. Flat plate electrode PC2 has a rectangular or substantially rectangular shape. Flat plate electrode PC2 at least partially overlaps with ground electrode PG1 of dielectric layer LY8, when stack body 110 is viewed in the stacking direction in a plan view. Capacitor C2 in first circuit CR1 of FIG. 1 is defined by flat plate electrode PC2 and ground electrode PG1.

Flat plate electrode P12 extends in the X axis direction and has a strip shape. A flat plate electrode PL21 is connected to one end of flat plate electrode P12. A flat plate electrode PL25 is connected to the other end of flat plate electrode P12.

Flat plate electrode PL21 has a strip shape with a U or substantially U shape or a C or substantially C shape. A via V21 is connected to an end portion of flat plate electrode PL21 opposite to an end portion thereof connected to flat plate electrode P12. Via V21 is connected to one end of a flat plate electrode PL22 disposed in dielectric layer LY5 and having a strip shape. Flat plate electrode PL22 has a U or substantially U shape or a C or substantially C shape. A via V22 is connected to the other end of flat plate electrode PL22. Via V22 is connected to one end of a flat plate electrode PL23 disposed in dielectric layer LY4 and having a strip shape. Flat plate electrode PL23 has a U or substantially U shape or a C or substantially C shape. A via V23 is connected to the other end of flat plate electrode PL23. Via V23 is connected to one end of a flat plate electrode PL24 disposed in dielectric layer LY3 and having a strip shape. Flat plate electrode PL24 has a U or substantially U shape or a C or substantially C shape. The other end of flat plate electrode PL24 is connected to first terminal T1 disposed on side surface 115.

When stack body 110 is viewed in the stacking direction in a plan view, flat plate electrodes PL21, PL22, PL23, PL24 are disposed such that most portions of paths thereof overlap with one another. That is, flat plate electrodes PL21, PL22, PL23, PL24 and vias V21, V22, V23 define a helical coil with a winding axis corresponding to the Z axis. This helical coil corresponds to inductor L21 in FIG. 1.

First terminal T1 is connected to a capacitor electrode PC3 disposed in dielectric layer LY9 and having a flat plate shape. Capacitor electrode PC3 at least partially overlaps with ground electrode PG1 of dielectric layer LY8 when stack body 110 is viewed in the stacking direction in a plan view. Capacitor C21 in second circuit CR2 of FIG. 1 is defined by flat plate electrode PC3 and ground electrode PG1.

Flat plate electrode PL25 in dielectric layer LY6 is an electrode having a strip shape with a U or substantially U shape or a C or substantially C shape. A via V25 is connected to an end portion of flat plate electrode PL25 opposite to an end portion thereof connected to flat plate electrode P12. Via V25 is connected to one end of a flat plate electrode PL26 disposed in dielectric layer LY5 and having a strip shape. Flat plate electrode PL26 has a U or substantially U shape or a C or substantially C shape. A via V26 is connected to the other end of flat plate electrode PL26. Via V26 is connected to one end of a flat plate electrode PL27 disposed in dielectric layer LY4 and having a strip shape. Flat plate electrode PL27 has a U or substantially U shape or a C or substantially C shape. A via V27 is connected to the other end of flat plate electrode PL27. Via V27 is connected to one end of a flat plate electrode PL28 disposed in dielectric layer LY3 and having a strip shape. Flat plate electrode PL28 has a U or substantially U shape or a C or substantially C shape. The other end of flat plate electrode PL28 is connected to second terminal T2 disposed on side surface 115.

When stack body 110 is viewed in the stacking direction in a plan view, flat plate electrodes PL25, PL26, PL27, PL28 are disposed such that most portions of paths thereof overlap with one another. That is, flat plate electrodes PL25, PL26, PL27, PL28 and vias V25, V26, V27 define a helical coil with a winding axis corresponding to the Z axis. This helical coil corresponds to inductor L22 in FIG. 1.

Second terminal T2 is connected to a capacitor electrode PC4 disposed in dielectric layer LY9 and having a flat plate shape. Capacitor electrode PC4 at least partially overlaps with ground electrode PG1 of dielectric layer LY8 when stack body 110 is viewed in the stacking direction in a plan view. Capacitor C22 in second circuit CR2 of FIG. 1 is defined by capacitor electrode PC4 and ground electrode PG1.

Resistive element R1 in second circuit CR2 of FIG. 1 is connected to first terminal T1 and second terminal T2. As shown in FIG. 2, resistive element R1 is defined by an individual chip resistor disposed outside stack body 110, and includes external terminals connected to first terminal T1 and second terminal T2. Alternatively, resistive element R1 may be defined by a flat plate electrode PR1 disposed inside stack body 110 or on upper surface 111. In the example of FIG. 3, flat plate electrode PR1 is, for example, an electrode extending in the X axis direction, disposed in dielectric layer LY2, and having a strip shape. One end of flat plate electrode PR1 is connected to first terminal T1 of side surface 115, and the other end of flat plate electrode PR1 is connected to second terminal T2 of side surface 115. Flat plate electrode PR1 may have, for example, a meandering shape in order to obtain a desired resistance value.

Figure 4:
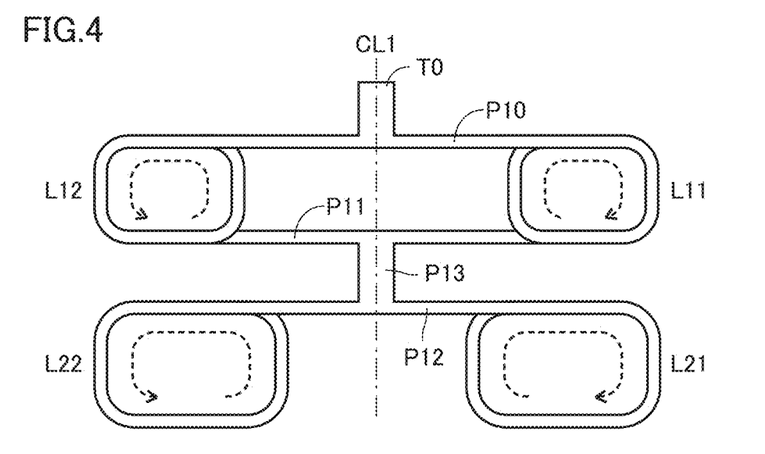
FIG. 4 is a diagram for illustrating an arrangement of each inductor in a stack.

FIG. 4 is a schematic diagram showing portions of inductors L11, L12, L21, L22 provided in dielectric layers LY2 to LY6, when viewed in the positive Z direction in a plan view. As shown in FIG. 4, inductor L11 and inductor L12 are disposed at line-symmetrical positions with respect to an imaginary line CL1 passing through common terminal T0. Also, inductor L21 and inductor L22 are disposed at line-symmetrical positions with respect to imaginary line CL1.

Further, the winding direction (CW direction: first direction) of inductor L11 is opposite to the winding direction (CCW direction: second direction) of inductor L12. The winding direction (CW direction) of inductor L21 is opposite to the winding direction (CCW direction) of inductor L22. On the other hand, the winding direction of inductor L11 is the same as the winding direction of inductor L21. The winding direction of inductor L12 is the same as the winding direction of inductor L22.

Since the inductors included in first circuit CR1 and second circuit CR2 are thus disposed symmetrically in stack body 110, the path from common terminal T0 to first terminal T1 and the path from common terminal T0 to second terminal T2 can be structurally symmetrical. Further, since the winding directions of the inductors disposed on the same side with respect to imaginary line CL1 are the same and the winding directions of the inductors disposed on the opposite sides with respect to imaginary line CL1 are opposite, electromagnetic fields generated by the inductors can be symmetrical.

Since such a configuration is structurally and electromagnetically symmetrical, fluctuations in phase difference and amplitude difference in power divider 100 can be reduced or prevented. Further, since the winding directions of the inductors disposed on the same side with respect to imaginary line CL1 are the same, the electromagnetic fields generated by inductor L11 and inductor L21 can be prevented from canceling each other and the electromagnetic fields generated by inductor L12 and inductor L22 can be prevented from canceling each other, thus preventing a decreased electromagnetic characteristic.

Characteristics of Power Divider

Figure 5:
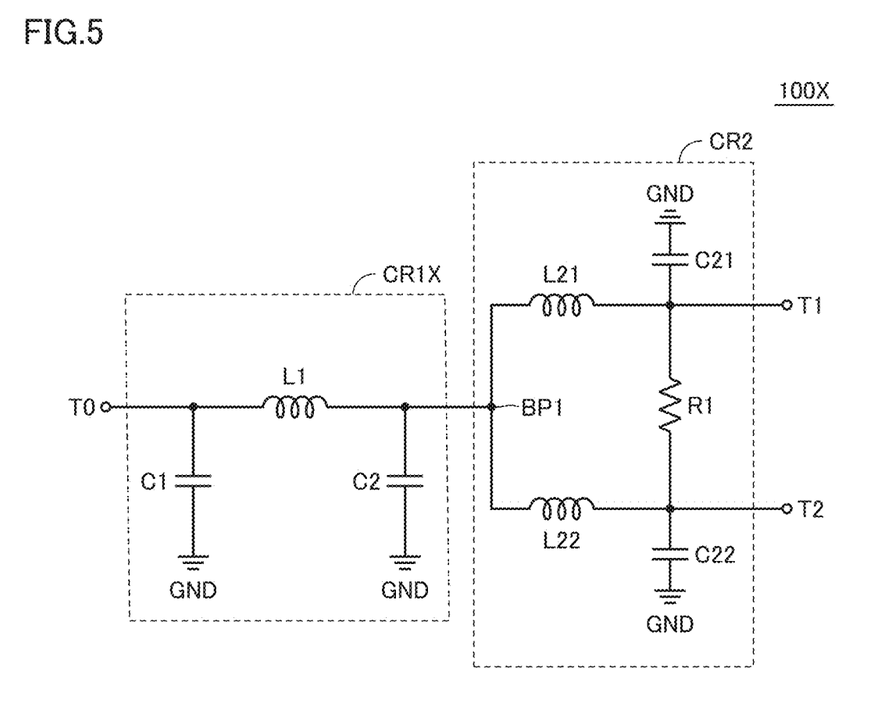
FIG. 5 is an equivalent circuit diagram of a power divider according to a comparative example.

Characteristics of power divider 100 according to the first example embodiment and a comparative example will be described. FIG. 5 is an equivalent circuit diagram of a power divider 100X according to the comparative example. Referring to FIG. 5, power divider 100X has a configuration in which first circuit CR1 in power divider 100 of FIG. 1 is replaced with a first circuit CR1X. Second circuit CR2 in power divider 100X is the same or substantially the same as that in power divider 100. In first circuit CR1X of power divider 100X, the parallel circuit of inductors L11, L12 in power divider 100 is replaced with a single inductor L1.

Figure 6:
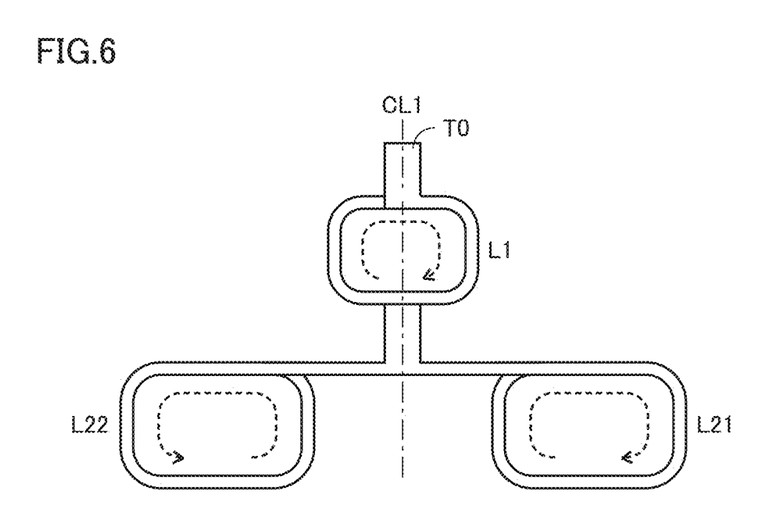
FIG. 6 is a diagram for illustrating an arrangement of each inductor in the comparative example.

FIG. 6 is a diagram for illustrating an overview of an arrangement of each inductor in power divider 100X of the comparative example, and is a diagram corresponding to FIG. 4. Referring to FIG. 6, in the case of power divider 100X, a substantially line-symmetrical configuration with respect to imaginary line CL2 can be structurally obtained. However, since there is one inductor L1 in first circuit CR1X, the winding direction of inductor L1 is opposite to the winding direction of inductor L21 or inductor L22. Therefore, electromagnetic fields generated in power divider 100X are not symmetrical, with the result that the electromagnetic fields are cancelled by the inductors having opposite winding directions (inductor L1 and inductor L22 in FIG. 6). This can lead to the occurrence of fluctuations in phase difference and amplitude difference in power divider 100X.

Figure 7:
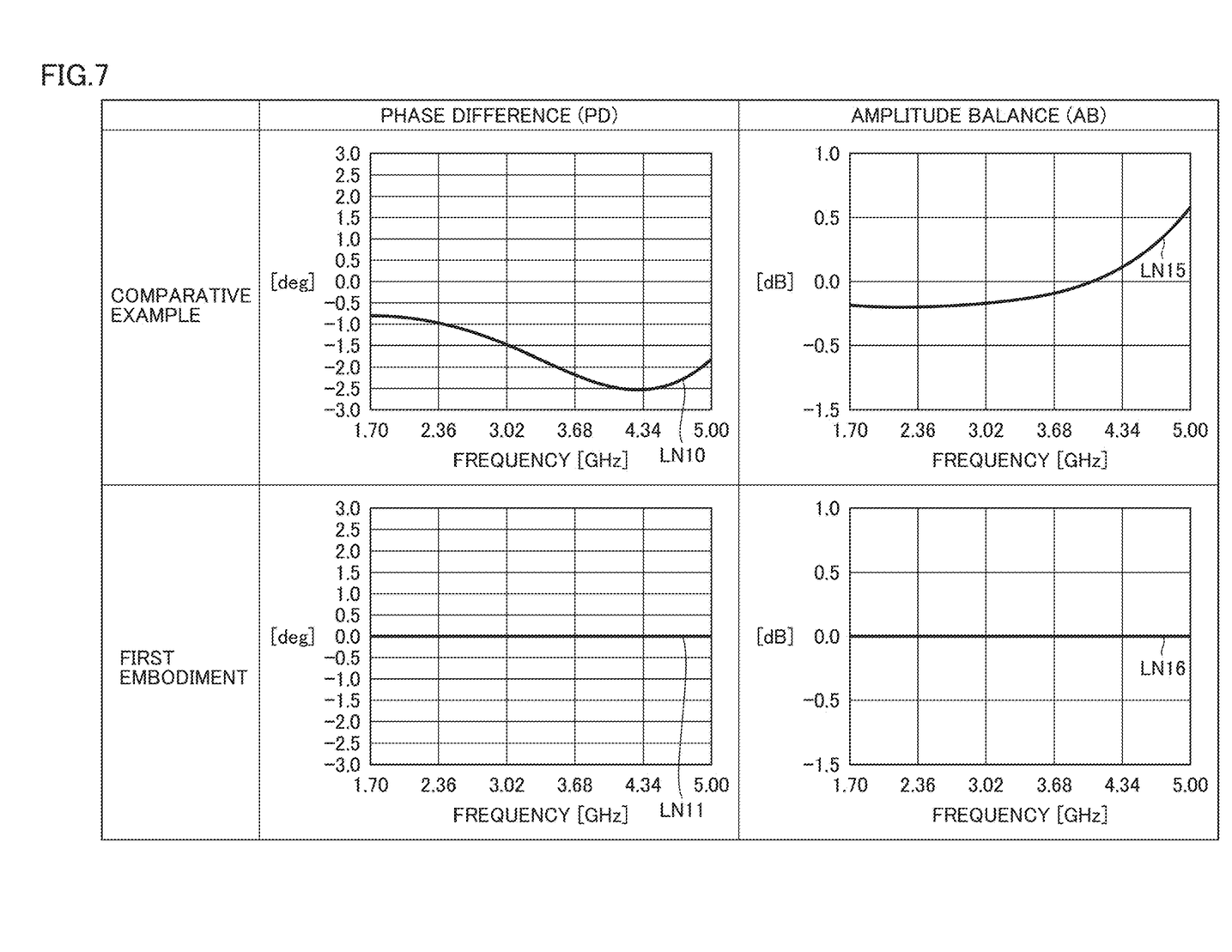
FIG. 7 is a diagram showing characteristics in the power dividers according to the first example embodiment of the present invention and the comparative example.

FIG. 7 is a diagram showing comparisons between phase differences (PD) and amplitude balances (AB) in power divider 100 of the first example embodiment and power divider 100X of the comparative example. The upper portion of FIG. 7 shows the characteristic of power divider 100X of the comparative example The lower portion of FIG. 7 shows the characteristic of power divider 100 of the first example embodiment.

Referring to FIG. 7, in the case of power divider 100X of the comparative example, each of the phase difference (line LN10) and the amplitude balance (line LN15) fluctuates more greatly as the frequency becomes higher. On the other hand, in the case of power divider 100 of the first example embodiment, each of the phase difference (line LN11) and the amplitude balance (line LN16) is almost zero even though the frequency is changed. The phase difference and the amplitude difference of the first example embodiment are improved as compared with the comparative example.

As described above, in power divider 100 of the first example embodiment, the two inductors connected in parallel are disposed between common terminal T0 and branching point BP1, and each inductor is disposed such that the path from common terminal T0 to first terminal T1 and the path from common terminal T0 to second terminal T2 are line-symmetrical when the stack body is viewed in a plan view. Such a configuration can improve the phase difference and the amplitude difference.

In the above description, it has been illustratively described that power divider 100 outputs, from each of first terminal T1 and second terminal T2, the signal having been input to common terminal T0. However, conversely, power divider 100 can define and function as a power combiner that combines signals having been input to first terminal T1 and second terminal T2 and outputs the combined signal from common terminal T0.

"Inductor L11", "inductor L12", "inductor L21" and "inductor L22" in the first example embodiment correspond to the "first inductor", the "second inductor", the "third inductor" and the "fourth inductor", respectively. "Capacitor C1", "capacitor C2", "capacitor C21" and "capacitor C22" in the first example embodiment correspond to the "first capacitor", the "second capacitor", the "third capacitor" and the "fourth capacitor".

Second Example Embodiment

In a second example embodiment of the present invention, the following describes a configuration in which a circuit is further added to the second circuit of the power divider.

Circuit Configuration of Power Divider

Figure 8:
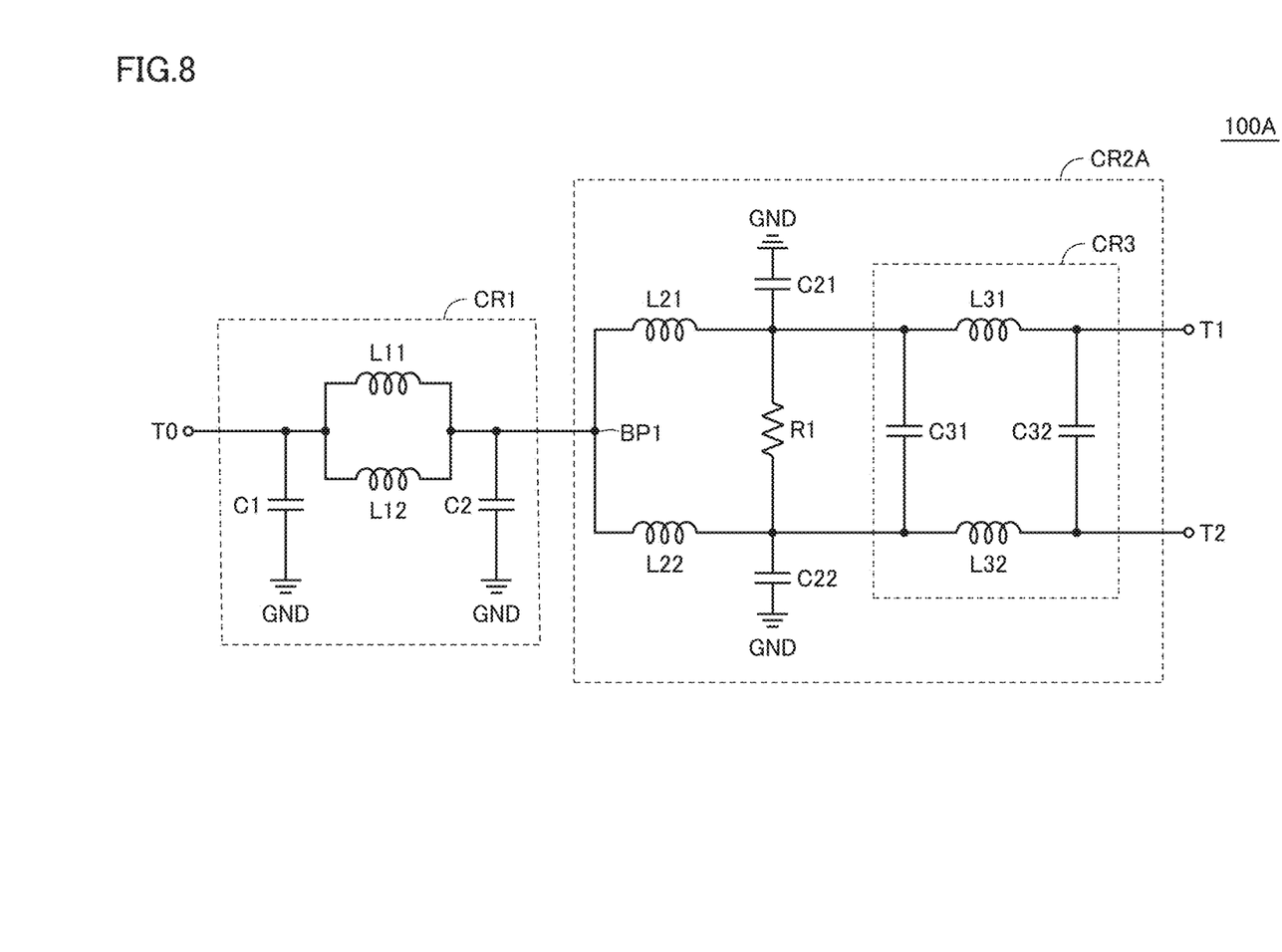
FIG. 8 is an equivalent circuit diagram of a power divider according to a second example embodiment of the present invention.

FIG. 8 is an equivalent circuit diagram of a power divider 100A according to the second example embodiment. Power divider 100A has a configuration in which second circuit CR2 in power divider 100 of the first example embodiment is replaced with a second circuit CR2A. Second circuit CR2A further includes a third circuit CR3 in addition to the configuration of second circuit CR2 of the first example embodiment. The same or corresponding elements in power divider 100A as those of power divider 100 of the first example embodiment will not be described repeatedly.

Referring to FIG. 8, third circuit CR3 is disposed between the configuration of second circuit CR2 and each of first terminal T1 and second terminal T2. Third circuit CR3 includes inductors L31, L32 and capacitors C31, C32.

Inductor L31 is connected between inductor L21 and first terminal T1. In other words, inductors L21, L31 are connected in series between branching point BP1 and first terminal T1. Inductor L32 is connected between inductor L22 and second terminal T2. In other words, inductors L22, L32 are connected in series between branching point BP1 and second terminal T2.

Capacitor C31 is connected to resistive element R1 in parallel. Capacitor C32 is connected between first terminal T1 and second terminal T2.

One attenuation pole is further defined, in the isolation characteristics of the path from first terminal T1 to second terminal T2, by third circuit CR3 included in second circuit CR2A.

Structure of Power Divider

Figure 9:
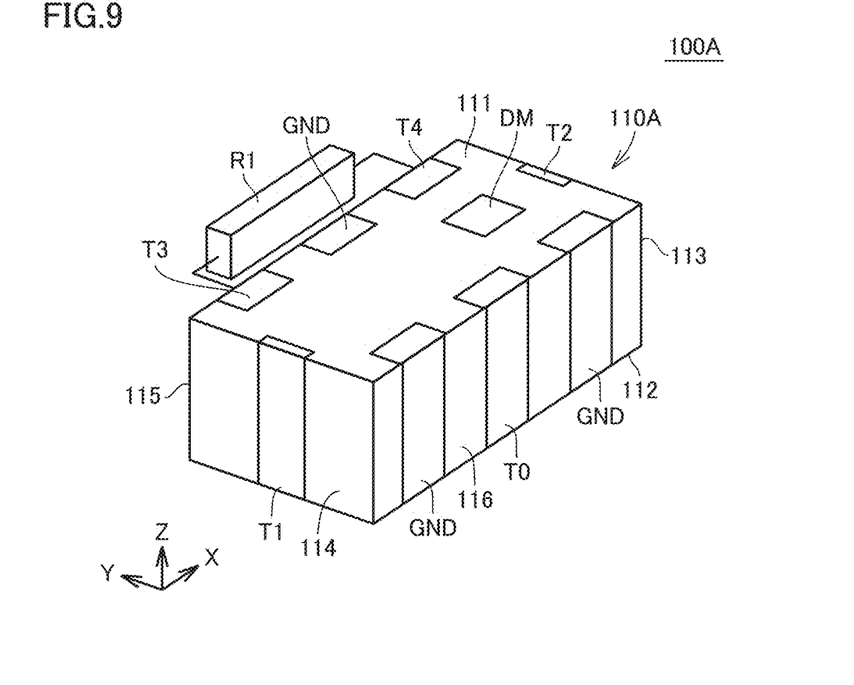
FIG. 9 is a perspective view of an outer shape of the power divider according to the second example embodiment of the present invention.

Next, a detailed structure of power divider 100A will be described with reference to FIGS. 9 and 10. FIG. 9 is a perspective view of an outer shape of power divider 100A, and FIG. 10 is an exploded perspective view showing an exemplary stack structure of power divider 100A.

Figure 10:
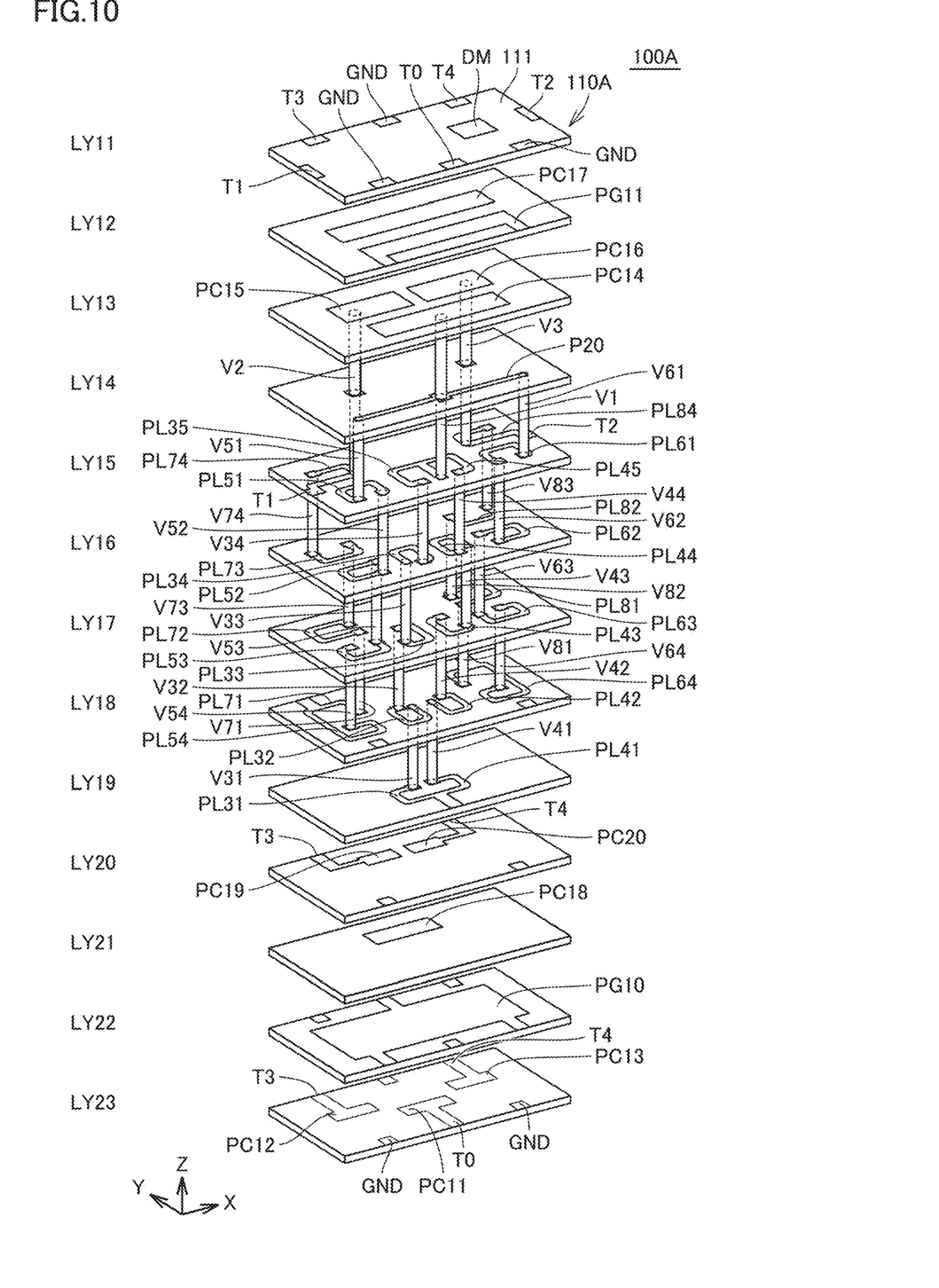
FIG. 10 is an exploded perspective view of the power divider of FIG. 9.

Referring to FIGS. 9 and 10, power divider 100A includes a stack body 110A and resistive element R1 provided outside stack body 110A. In the stack body 110A, a plurality of dielectric layers LY11 to LY23 are stacked in the stacking direction. Stack body 110A has a cuboid or substantially cuboid shape. As with the first example embodiment, each of dielectric layers LY11 to LY23 is made of, for example, a resin or a ceramic such as a low-temperature co-fired ceramic (LTCC).

A directional mark DM to specify a direction of power divider 100A is disposed on an upper surface 111 (dielectric layer LY11) of stack body 110A. In stack body 110A, external terminals are also disposed on side surfaces 113, 114. The external terminal of side surface 114 is first terminal T1. The external terminal of side surface 113 is second terminal T2. Common terminal T0 and ground terminal GND are disposed on side surface 116. Ground terminal GND and connection terminals T3, T4 are disposed on side surface 115. Resistive element R1 is connected to connection terminals T3, T4.

Common terminal T0 is connected to a capacitor electrode PC11 disposed in dielectric layer LY23 on a side of the lower surface 112. When stack body 110A is viewed in the stacking direction in a plan view, capacitor electrode PC11 at least partially overlaps with a ground electrode PG10 disposed in dielectric layer LY22. Ground electrode PG10 has a rectangular or substantially rectangular shape. Ground electrode PG10 is connected to ground terminals GND. Capacitor C1 in first circuit CR1 of FIG. 8 is defined by capacitor electrode PC11 and ground electrode PG10.

Common terminal T0 is also connected to flat plate electrodes PL31, PL41 disposed in dielectric layer LY19. Each of flat plate electrodes PL31, PL41 has a strip shape with a U or substantially U shape or a C or substantially C shape. One end of flat plate electrode PL31 and one end of flat plate electrode PL41 are connected to each other. Common terminal T0 is connected to a connection portion between flat plate electrode PL31 and flat plate electrode PL41. A via V31 is connected to the other end of flat plate electrode PL31, and a via V41 is connected to the other end of flat plate electrode PL41.

Via V31 is connected to one end of a flat plate electrode PL32 disposed in dielectric layer LY18 and having a strip shape. Flat plate electrode PL32 has a U or substantially U shape or a C or substantially C shape. A via V32 is connected to the other end of flat plate electrode PL32. Via V32 is connected to one end of a flat plate electrode PL33 disposed in dielectric layer LY17 and having a strip shape. Flat plate electrode PL33 has a U or substantially U shape or a C or substantially C shape. A via V33 is connected to the other end of flat plate electrode PL33. Via V33 is connected to one end of a flat plate electrode PL34 disposed in dielectric layer LY16 and having a strip shape. Flat plate electrode PL34 has a U or substantially U shape or a C or substantially C shape. A via V34 is connected to the other end of flat plate electrode PL34. Via V34 is connected to one end of a flat plate electrode PL35 disposed in dielectric layer LY15 and having a strip shape. Flat plate electrode PL35 has a U or substantially U shape or a C or substantially C shape.

When stack body 110A is viewed in the stacking direction in a plan view, flat plate electrodes PL31, PL32, PL33, PL34, PL35 are disposed such that most portions of paths thereof overlap with one another. That is, flat plate electrodes PL31, PL32, PL33, PL34, PL35 and vias V31, V32, V33, V34 define a helical coil with a winding axis corresponding to the Z axis. This helical coil corresponds to inductor L11 in FIG. 8.

Via V41 is connected to one end of a flat plate electrode PL42 disposed in dielectric layer LY18 and having a strip shape. Flat plate electrode PL42 has a U or substantially U shape or a C or substantially C shape. A via V42 is connected to the other end of flat plate electrode PL42. Via V42 is connected to one end of a flat plate electrode PL43 disposed in dielectric layer LY17 and having a strip shape. Flat plate electrode PL43 has a U or substantially U shape or a C or substantially C shape. A via V43 is connected to the other end of flat plate electrode PL43. Via V43 is connected to one end of a flat plate electrode PL44 disposed in dielectric layer LY16 and having a strip shape. Flat plate electrode PL44 has a U or substantially U shape or a C or substantially C shape. A via V44 is connected to the other end of flat plate electrode PL44. Via V44 is connected to one end of a flat plate electrode PL45 disposed in dielectric layer LY15 and having a strip shape. Flat plate electrode PL45 has a U or substantially U shape or a C or substantially C shape.

When stack body 110A is viewed in the stacking direction in a plan view, flat plate electrodes PL41, PL42, PL43, PL44, PL45 are disposed such that most portions of paths thereof overlap with one another. That is, flat plate electrodes PL41, PL42, PL43, PL44, PL45 and vias V41, V42, V43, V44 define a helical coil having a winding axis corresponding to the Z axis. This helical coil corresponds to inductor L12 in FIG. 8.

In dielectric layer LY15, a portion of flat plate electrode PL35 overlaps with a portion of flat plate electrode PL45. The other end of flat plate electrode PL35 and the other end of flat plate electrode PL45 are the same. A via V1 is connected to the other ends of flat plate electrode PL35 and flat plate electrode PL45.

Via V1 is connected to a flat plate electrode P20 disposed in dielectric layer LY14 and a capacitor electrode PC14 disposed in dielectric layer LY13. Each of flat plate electrode P20 and capacitor electrode PC14 extends in the X axis direction and has a strip shape, and is connected to via V1 at its central portion in the extending direction.

When stack body 110A is viewed in the stacking direction in a plan view, a portion of capacitor electrode PC14 overlaps with a ground electrode PG11 disposed in dielectric layer LY12. Ground electrode PG11 extends in the X axis direction and has a strip shape. Both end portions of ground electrode PG11 are connected to ground terminals GND disposed on side surface 116. Capacitor C2 in the equivalent circuit of FIG. 8 is defined by capacitor electrode PC14 and ground electrode PG11.

A via V51 is connected to one end of flat plate electrode P20 in dielectric layer LY14. A via V61 is connected to the other end of flat plate electrode P20. Via V51 is connected to one end of a flat plate electrode PL51 disposed in dielectric layer LY15. Flat plate electrode PL51 has a U or substantially U shape or a C or substantially C shape. A via V52 is connected to the other end of flat plate electrode PL51. Via V52 is connected to one end of a flat plate electrode PL52 disposed in dielectric layer LY16 and having a strip shape. Flat plate electrode PL52 has a U or substantially U shape or a C or substantially C shape. A via V53 is connected to the other end of flat plate electrode PL52. Via V53 is connected to one end of a flat plate electrode PL53 disposed in dielectric layer LY17 and having a strip shape. Flat plate electrode PL53 has a U or substantially U shape or a C or substantially C shape. A via V54 is connected to the other end of flat plate electrode PL53. Via V54 is connected to one end of a flat plate electrode PL54 disposed in dielectric layer LY18 and having a strip shape. Flat plate electrode PL53 has a U or substantially U shape or a C or substantially C shape. The other end of flat plate electrode PL53 is connected to connection terminal T3 disposed on side surface 115, and is also connected to one end of a flat plate electrode PL71 having a strip shape.

When stack body 110A is viewed in the stacking direction in a plan view, flat plate electrodes PL51, PL52, PL53, PL54 are disposed such that most portions of paths thereof overlap with one another. That is, flat plate electrodes PL51, PL52, PL53, PL54 and vias V51, V52, V53, V54 define a helical coil with a winding axis corresponding to the Z axis. This helical coil corresponds to inductor L21 in FIG. 8.

Via V61 is connected to one end of a flat plate electrode PL61 disposed in dielectric layer LY15. Flat plate electrode PL61 has a U or substantially U shape or a C or substantially C shape. A via V62 is connected to the other end of flat plate electrode PL61. Via V62 is connected to one end of a flat plate electrode PL62 disposed in dielectric layer LY16 and having a strip shape. Flat plate electrode PL62 has a U or substantially U shape or a C or substantially C shape. A via V63 is connected to the other end of flat plate electrode PL62. Via V63 is connected to one end of a flat plate electrode PL63 disposed in dielectric layer LY17 and having a strip shape. Flat plate electrode PL63 has a U or substantially U shape or a C or substantially C shape. A via V64 is connected to the other end of flat plate electrode PL63. Via V64 is connected to one end of a flat plate electrode PL64 disposed in dielectric layer LY18 and having a strip shape. Flat plate electrode PL63 has a U or substantially U shape or a C or substantially C shape. The other end of flat plate electrode PL63 is connected to connection terminal T4 disposed on side surface 115, and is also connected to one end of flat plate electrode PL81 having a strip shape.

When stack body 110A is viewed in the stacking direction in a plan view, flat plate electrodes PL61, PL62, PL63, PL64 are disposed such that most portions of paths thereof overlap with one another. That is, flat plate electrodes PL61, PL62, PL63, PL64 and vias V61, V62, V63, V64 define a helical coil with a winding axis corresponding to the Z axis. This helical coil corresponds to inductor L22 in FIG. 8.

A via V71 is connected to the other end of flat plate electrode PL71 in dielectric layer LY18. Via V71 is connected to one end of a flat plate electrode PL72 disposed in dielectric layer LY17 and having a strip shape. Flat plate electrode PL72 has a U or substantially U shape or a C or substantially C shape. A via V72 is connected to the other end of flat plate electrode PL72. Via V72 is connected to one end of a flat plate electrode PL73 disposed in dielectric layer LY16 and having a strip shape. Flat plate electrode PL73 has a U or substantially U shape or a C or substantially C shape. A via V74 is connected to the other end of flat plate electrode PL73. Via V74 is connected to one end of a flat plate electrode PL74 disposed in dielectric layer LY15 and having a strip shape. Flat plate electrode PL74 has a U or substantially U shape or a C or substantially C shape. The other end of flat plate electrode PL74 is connected to first terminal T1 disposed on side surface 114.

When stack body 110A is viewed in the stacking direction in a plan view, flat plate electrodes PL71, PL72, PL73, PL74 are disposed such that most portions of paths thereof overlap with one another. That is, flat plate electrodes PL71, PL72, PL73, PL74 and vias V71, V72, V73 define a helical coil with a winding axis corresponding to the Z axis. This helical coil corresponds to inductor L31 in FIG. 8.

A via V81 is connected to the other end of flat plate electrode PL81 in dielectric layer LY18. Via V81 is connected to one end of a flat plate electrode PL82 disposed in dielectric layer LY17 and having a strip shape. Flat plate electrode PL82 has a U or substantially U shape or a C or substantially C shape. A via V82 is connected to the other end of flat plate electrode PL82. Via V82 is connected to one end of a flat plate electrode PL83 disposed in dielectric layer LY16 and having a strip shape. Flat plate electrode PL83 has a U or substantially U shape or a C or substantially C shape. A via V84 is connected to the other end of flat plate electrode PL83. Via V84 is connected to one end of a flat plate electrode PL84 disposed in dielectric layer LY15 and having a strip shape. Flat plate electrode PL84 has a U or substantially U shape or a C or substantially C shape. The other end of flat plate electrode PL84 is connected to second terminal T2 disposed on side surface 113.

When stack body 110A is viewed in the stacking direction in a plan view, flat plate electrodes PL81, PL82, PL83, PL84 are disposed such that most portions of paths thereof overlap with one another. That is, flat plate electrodes PL81, PL82, PL83, PL84 and vias V81, V82, V83 define a helical coil having a winding axis corresponding to the Z axis. This helical coil corresponds to inductor L32 in FIG. 8.

In dielectric layer LY15, a via V2 is connected in a portion of flat plate electrode PL74. Via V2 is connected to a capacitor electrode PC15 disposed in dielectric layer LY13. Capacitor electrode PC15 extends in the X axis direction and has a strip shape. Similarly, in dielectric layer LY15, a via V3 is connected in a portion of flat plate electrode PL84. Via V3 is connected to a capacitor electrode PC16 disposed in dielectric layer LY13. Capacitor electrode PC16 extends in the X axis direction and has a strip shape.

When stack body 110A is viewed in the stacking direction in a plan view, a portion of capacitor electrode PC15 and a portion of capacitor electrode PC16 overlap with a capacitor electrode PC17 disposed in dielectric layer LY12. Capacitor electrode PC17 extends in the X axis direction and has a strip shape. Capacitor C32 in the equivalent circuit of FIG. 8 is defined by capacitor electrodes PC15, PC16, PC17.

Connection terminal T3 disposed on side surface 115 of stack body 110A is connected to flat plate electrodes PL54, PL71 disposed in dielectric layer LY18, a capacitor electrode PC19 disposed in dielectric layer LY20, and a capacitor electrode PC12 disposed in dielectric layer LY23. When stack body 110A is viewed in the stacking direction in a plan view, a portion of capacitor electrode PC12 disposed in dielectric layer LY23 overlaps with ground electrode PG11 of dielectric layer LY22. Capacitor C21 in the equivalent circuit of FIG. 8 is defined by capacitor electrode PC12 and ground electrode PG11.

Connection terminal T4 disposed on side surface 115 of stack body 110A is connected to flat plate electrodes PL64, PL81 disposed in dielectric layer LY18, a capacitor electrode PC20 disposed in dielectric layer LY20, and a capacitor electrode PC13 disposed in dielectric layer LY23. When stack body 110A is viewed in the stacking direction in a plan view, a portion of capacitor electrode PC13 disposed in dielectric layer LY23 overlaps with ground electrode PG11 of dielectric layer LY22. Capacitor C22 in the equivalent circuit of FIG. 8 is defined by capacitor electrode PC13 and ground electrode PG11.

A portion of capacitor electrode PC19 disposed in dielectric layer LY20 and a portion of capacitor electrode PC20 overlap with capacitor electrode PC18 disposed in dielectric layer LY21, when stack body 110A is viewed in the stacking direction in a plan view. Capacitor C31 in the equivalent circuit of FIG. 8 is defined by capacitor electrodes PC18, PC19, PC20.

Although not shown in FIG. 10, resistive element R1 provided outside stack body 110A is connected to connection terminals T3, T4. Resistive element R1 may be disposed inside stack body 110A.

Figure 11:
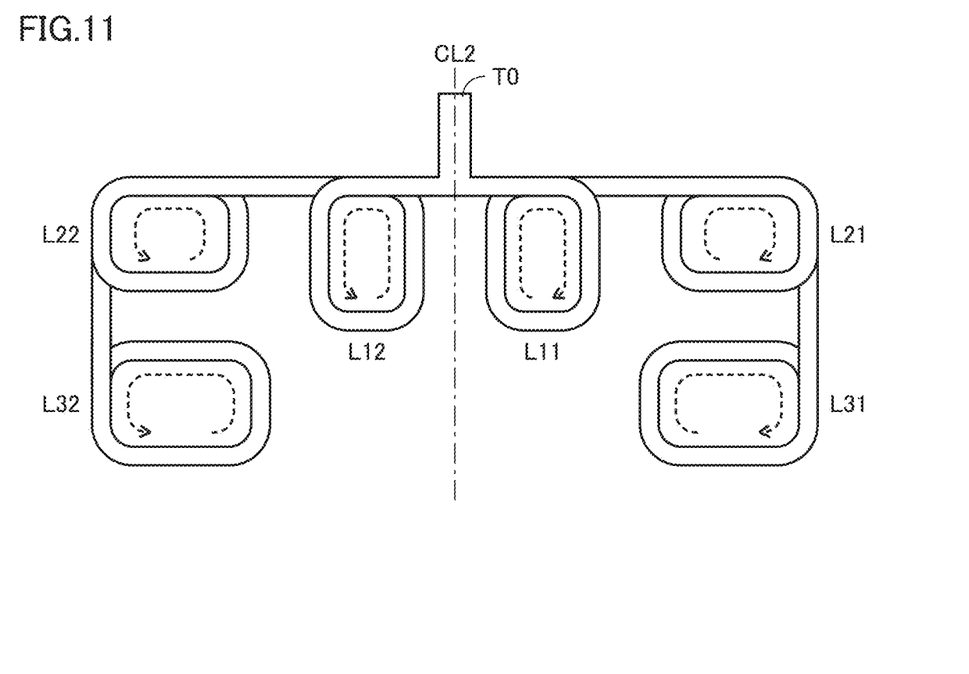
FIG. 11 is a diagram for illustrating an arrangement of each inductor in a stack.

FIG. 11 is a schematic plan view showing portions of inductors L11, L12, L21, L22, L31, L32 provided in dielectric layers LY15 to LY19, when viewed in the positive Z axis direction in a plan view. As shown in FIG. 11, inductor L11 and inductor L12 are disposed at line-symmetrical positions with respect to an imaginary line CL2 passing through common terminal T0. Also, inductor L21 and inductor L22 are disposed at line-symmetrical positions with respect to imaginary line CL2, and inductor L31 and inductor L32 are disposed at line-symmetrical positions with respect to imaginary line CL2.

The winding directions of inductors L11, L21, L31 are the same, i.e., the CW direction. On the other hand, the winding directions of inductors L12, L22, L32 are the same, i.e., the CCW direction.

Since the inductors included in stack body 110A are disposed symmetrically in this manner, the path from common terminal T0 to first terminal T1 and the path from common terminal T0 to second terminal T2 can be structurally symmetrical. Further, the winding directions of the inductors disposed on the same side with respect to imaginary line CL2 are the same and the winding directions of the inductors disposed on the opposite sides with respect to imaginary line CL2 are opposite. In such a configuration, electromagnetic fields generated by the inductors can be symmetrical.

Since such a configuration is structurally and electromagnetically symmetrical, fluctuations in phase difference and amplitude difference in power divider 100A can be reduced or prevented. Further, since the winding directions of the inductors disposed on the same side with respect to imaginary line CL2 are the same, the electromagnetic fields generated by inductors L11, L21, L31 can be prevented from canceling one another and the electromagnetic fields generated by inductors L12, L22, L32 can be prevented from canceling one another, thus preventing a decreased electromagnetic characteristic.

Isolation Characteristics

Figure 12:
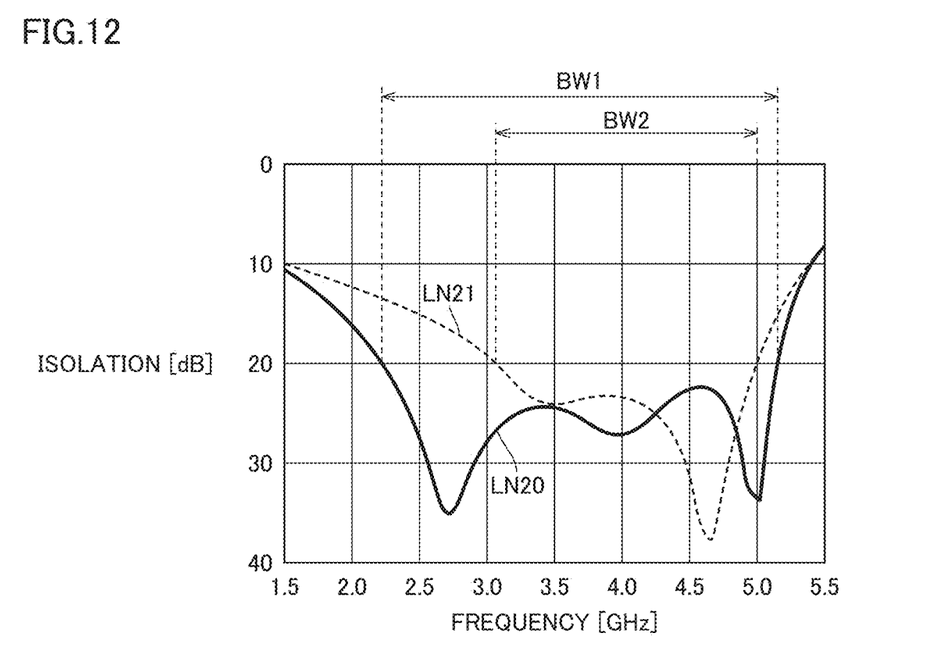
FIG. 12 is a first diagram showing a characteristic of the power divider according to the second example embodiment of the present invention.

FIG. 12 is a diagram showing isolation between first terminal T1 and second terminal T2 in each of power divider 100A of the second example embodiment and power divider 100X of the comparative example shown in the first example embodiment. In FIG. 12, a solid line LN20 represents power divider 100A of the second example embodiment, and a broken line LN21 represents power divider 100X of the comparative example.

Referring to FIG. 12, in power divider 100X of the comparative example, attenuation poles are generated at two positions around 3.5 GHZ and 4.7 GHZ. On the other hand, in power divider 100A according to the second example embodiment, an attenuation pole is added by third circuit CR3, and attenuation poles are generated at three positions around 2.7 GHZ, 3.9 GHZ, and 5.0 GHZ. Thus, an overall amount of attenuation in power divider 100A of the second example embodiment is larger than that of the comparative example. Therefore, for example, in a comparison between frequency bandwidths by which an isolation of about 20 dB can be achieved, a bandwidth BW1 of power divider 100A is larger than a bandwidth BW2 in the comparative example (BW1>BW2). In other words, a wider band of the isolation characteristics is achieved.

Figure 13:
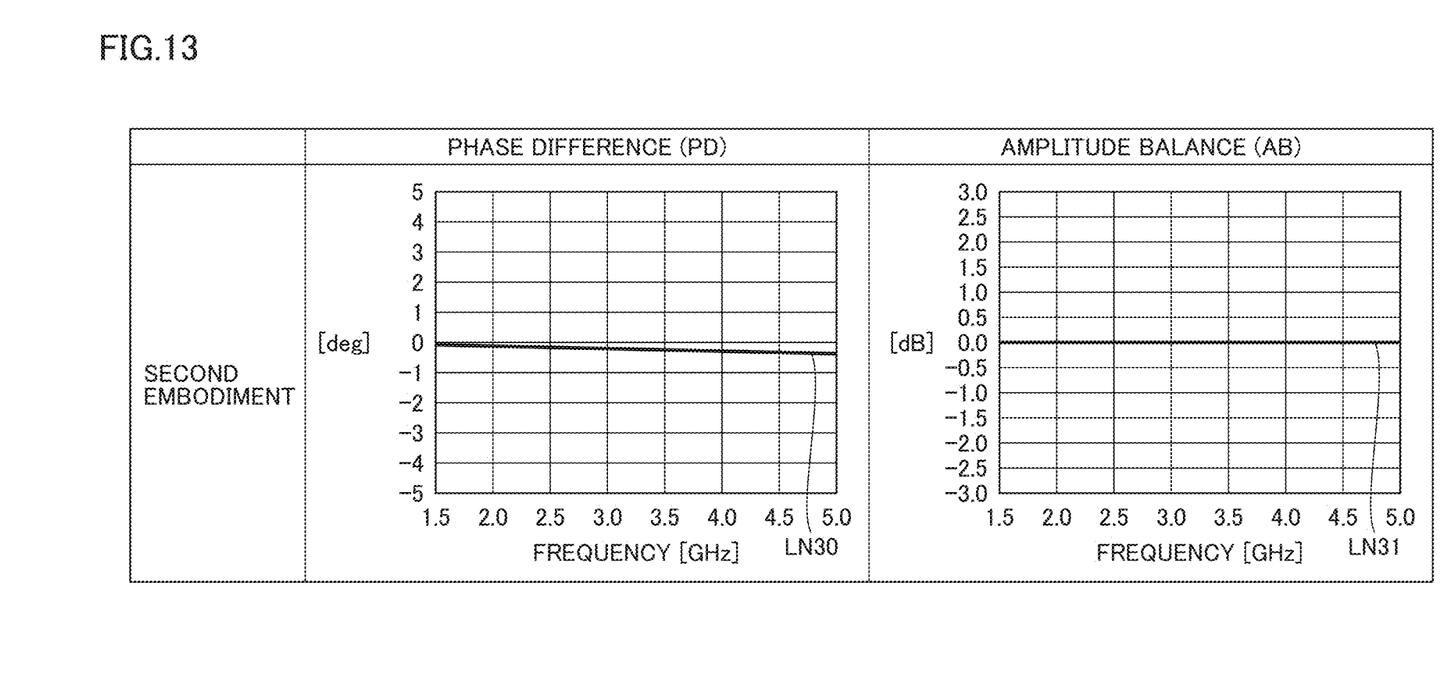
FIG. 13 is a second diagram showing a characteristic of the power divider according to the second example embodiment of the present invention.

FIG. 13 is a diagram showing a phase difference (PD) and an amplitude balance (AB) between first terminal T1 and second terminal T2 in power divider 100A according to the second example embodiment. Regarding the phase difference (line LN30), there is a slight phase difference as the frequency is higher. However, the phase difference is limited to be less than about 1°. Regarding the amplitude balance (line LN31), 0 dB is achieved in the entire frequency range. That is, also in the configuration of power divider 100A of the second example embodiment, fluctuations in phase difference and amplitude difference are reduced or prevented as compared with the comparative example shown in FIG. 7.

As described above, since the inductors are symmetrically disposed and the winding directions of the inductors are also symmetrical in the configuration in which the third circuit is added to the circuit subsequent to the signal dividing in the power divider, fluctuations in phase difference and amplitude difference can be reduced or prevented.

"Inductor L31" and "inductor L32" in the second example embodiment correspond to the "fifth inductor" and the "sixth inductor", respectively. "Capacitor C31" and the "capacitor C32" in the second example embodiment correspond to the "fifth capacitor" and the "sixth capacitor", respectively.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A power divider comprising:
   a common terminal;
   a ground terminal;
   a first terminal and a second terminal;
   a first circuit connected to the common terminal;
   a second circuit connected to the first terminal and the second terminal to divide a signal having passed through the first circuit at a branching point and to transfer divided signals to the first terminal and the second terminal; and
   a stack body including a plurality of dielectric layers that are stacked; wherein
   the first circuit includes:
      a first inductor and a second inductor connected in parallel between the common terminal and the branching point;
      a first capacitor connected between the common terminal and the ground terminal; and
      a second capacitor connected between the branching point and the ground terminal;
   the second circuit includes:
      a third inductor including one end connected to the branching point, the third inductor being located in a path from the branching point to the first terminal;
      a fourth inductor including one end connected to the branching point, the fourth inductor being located in a path from the branching point to the second terminal;
      a third capacitor connected between another end of the third inductor and the ground terminal;
      a fourth capacitor connected between another end of the fourth inductor and the ground terminal; and
      a resistor connected between the another end of the third inductor and the another end of the fourth inductor;
   each of the first inductor, the second inductor, the third inductor, and the fourth inductor is a coil located inside the stack body and having a winding axis corresponding to a stacking direction of the stack body; and
   when the stack body is viewed in the stacking direction in a plan view:
      the first inductor and the second inductor are located at line-symmetrical positions with respect to an imaginary line passing through the common terminal; and
      the third inductor and the fourth inductor are located at line-symmetrical positions with respect to the imaginary line.

2. The power divider according to claim 1, wherein when the stack body is viewed in the stacking direction in a plan view:
   a winding direction of each of the first inductor and the third inductor is a first direction; and
   a winding direction of each of the second inductor and the fourth inductor is a second direction opposite to the first direction.

3. The power divider according to claim 1, wherein the resistor is located outside the stack body.

4. The power divider according to claim 1, wherein the second circuit further includes:
   a fifth inductor connected between the another end of the third inductor and the first terminal;
   a sixth inductor connected between the another end of the fourth inductor and the second terminal;
   a fifth capacitor connected to the resistor in parallel; and
   a sixth capacitor connected between the first terminal and the second terminal.

5. The power divider according to claim 4, wherein
   each of the fifth inductor and the sixth inductor is a coil located inside the stack body and having a winding axis corresponding to the stacking direction of the stack body;
   when the stack body is viewed in the stacking direction in a plan view:
      the fifth inductor and the sixth inductor are located at line-symmetrical positions with respect to the imaginary line.

6. The power divider according to claim 5, wherein when the stack body is viewed in the stacking direction in a plan view:
   a winding direction of each of the first inductor, the third inductor, and the fifth inductor is a first direction; and
   a winding direction of each of the second inductor, the fourth inductor, and the sixth inductor is a second direction opposite to the first direction.

7. The power divider according to claim 5, wherein the resistor is located outside the stack body.

8. The power divider according to claim 1, wherein at least one attenuation pole is generated by the first circuit in an isolation characteristic of a path from the first terminal to the second terminal.

9. The power divider according to claim 1, wherein at least one attenuation pole is generated by the second circuit in an isolation characteristic of a path from the first terminal to the second terminal.

10. The power divider according to claim 1, wherein the stack body has a cuboid or substantially cuboid shape.

11. The power divider according to claim 1, wherein each of the plurality of dielectric layers is made of resin or ceramic.

12. The power divider according to claim 1, wherein the stack body includes a direction mark on an upper surface thereof.

13. The power divider according to claim 1, wherein the coil includes at least one via connected to a plurality of flat plate electrodes.

14. The power divider according to claim 13, wherein, when viewed in the stacking direction in a plan view, a majority of the plurality of flat plate electrodes overlap each other.

15. The power divider according to claim 13, wherein each of the plurality of flat plate electrodes have a U or substantially U shape or a C or substantially C shape.

16. The power divider according to claim 13, wherein the at least one via extends in the stacking direction in a plan view.

17. The power divider according to claim 13, wherein the at least one via is made of a conductive paste, plating or a metal pin.

* * * * *